United States Patent
Lee et al.

(10) Patent No.: US 10,014,269 B2
(45) Date of Patent: Jul. 3, 2018

(54) METHOD FOR WAFER DICING

(71) Applicant: TAIWAN SEMICONDUCTOR MANUFACTURING CO., LTD., Hsinchu (TW)

(72) Inventors: Yueh-Chuan Lee, Hsinchu (TW); Chia-Chan Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/654,512

(22) Filed: Jul. 19, 2017

(65) Prior Publication Data
US 2017/0317043 A1    Nov. 2, 2017

Related U.S. Application Data

(62) Division of application No. 14/577,141, filed on Dec. 19, 2014.

(51) Int. Cl.
*H01L 21/00* (2006.01)
*H01L 23/00* (2006.01)
*H01L 23/58* (2006.01)
*H01L 21/78* (2006.01)
(Continued)

(52) U.S. Cl.
CPC ........ *H01L 24/06* (2013.01); *H01L 21/30604* (2013.01); *H01L 21/78* (2013.01); *H01L 23/585* (2013.01); *H01L 24/03* (2013.01); *H01L 24/94* (2013.01); *H01L 33/0095* (2013.01); *H01L 2224/05016* (2013.01); *H01L 2224/06179* (2013.01); *H01L 2924/1033* (2013.01); *H01L 2924/10252* (2013.01);
(Continued)

(58) Field of Classification Search
CPC ......... H01L 2224/94; H01L 2224/0401; H01L 24/06; H01L 23/544; H01L 2223/5445
USPC .......................................... 438/113, 458, 459
See application file for complete search history.

(56) References Cited

U.S. PATENT DOCUMENTS 6,812,552 B2    11/2004    Islam et al.
8,637,991 B2    1/2014    Haba
(Continued)

FOREIGN PATENT DOCUMENTS

JP    2004-241673 A    8/2004
JP    2006-140338 A    6/2006
(Continued)

*Primary Examiner* — S. V. Clark
(74) *Attorney, Agent, or Firm* — Maschoff Brennan

(57) ABSTRACT

The semiconductor die includes a base body, protruding portions and bonding pads. The base body has sidewalls. The protruding portions are laterally protruding from the sidewalls respectively. The bonding pads are disposed on the protruding portions respectively. The wafer dicing method includes following operations. Chips are formed on a semiconductor wafer. Bonding pads are formed at a border line between every two of the adjacent chips. A scribe line is formed and disposed along the bonding pads. A photolithographic pattern is formed on a top layer of the semiconductor wafer to expose the scribe line. The scribe line is etched to a depth in the semiconductor wafer substantially below the top layer to form an etched pattern. A back surface of the semiconductor wafer is thinned until the etched pattern in the semiconductor wafer is exposed.

20 Claims, 16 Drawing Sheets

(51) Int. Cl.
*H01L 21/306* (2006.01)
*H01L 33/00* (2010.01)

(52) U.S. Cl.
CPC ............... *H01L 2924/10253* (2013.01); *H01L 2924/10271* (2013.01); *H01L 2924/10329* (2013.01); *H01L 2924/10331* (2013.01); *H01L 2924/10335* (2013.01); *H01L 2924/10336* (2013.01); *H01L 2924/10338* (2013.01); *H01L 2924/10342* (2013.01); *H01L 2924/10346* (2013.01); *H01L 2924/2064* (2013.01)

(56) References Cited

U.S. PATENT DOCUMENTS

| 8,802,500 B2 | 8/2014 | Do et al. |
| 2006/0103402 A1 | 5/2006 | Kondou |
| 2007/0052070 A1 | 3/2007 | Islam et al. |
| 2007/0052071 A1 | 3/2007 | Kobayashi et al. |
| 2008/0020559 A1* | 1/2008 | Chen ................ H01L 21/76895 438/597 |
| 2009/0194854 A1 | 8/2009 | Tan et al. |
| 2009/0230526 A1 | 9/2009 | Chen et al. |
| 2012/0119342 A1 | 5/2012 | Chang Chien et al. |
| 2013/0154067 A1 | 6/2013 | Pagaila et al. |
| 2013/0241041 A1 | 9/2013 | Yu et al. |
| 2014/0057411 A1 | 2/2014 | Hoang et al. |
| 2017/0141051 A1* | 5/2017 | Yu .......................... H01L 23/585 |
| 2017/0179044 A1* | 6/2017 | Hsu ........................ H01L 23/544 |

FOREIGN PATENT DOCUMENTS

| JP | 2008160148 A | 7/2008 |
| KR | 10-2014-0044879 A | 4/2014 |

* cited by examiner

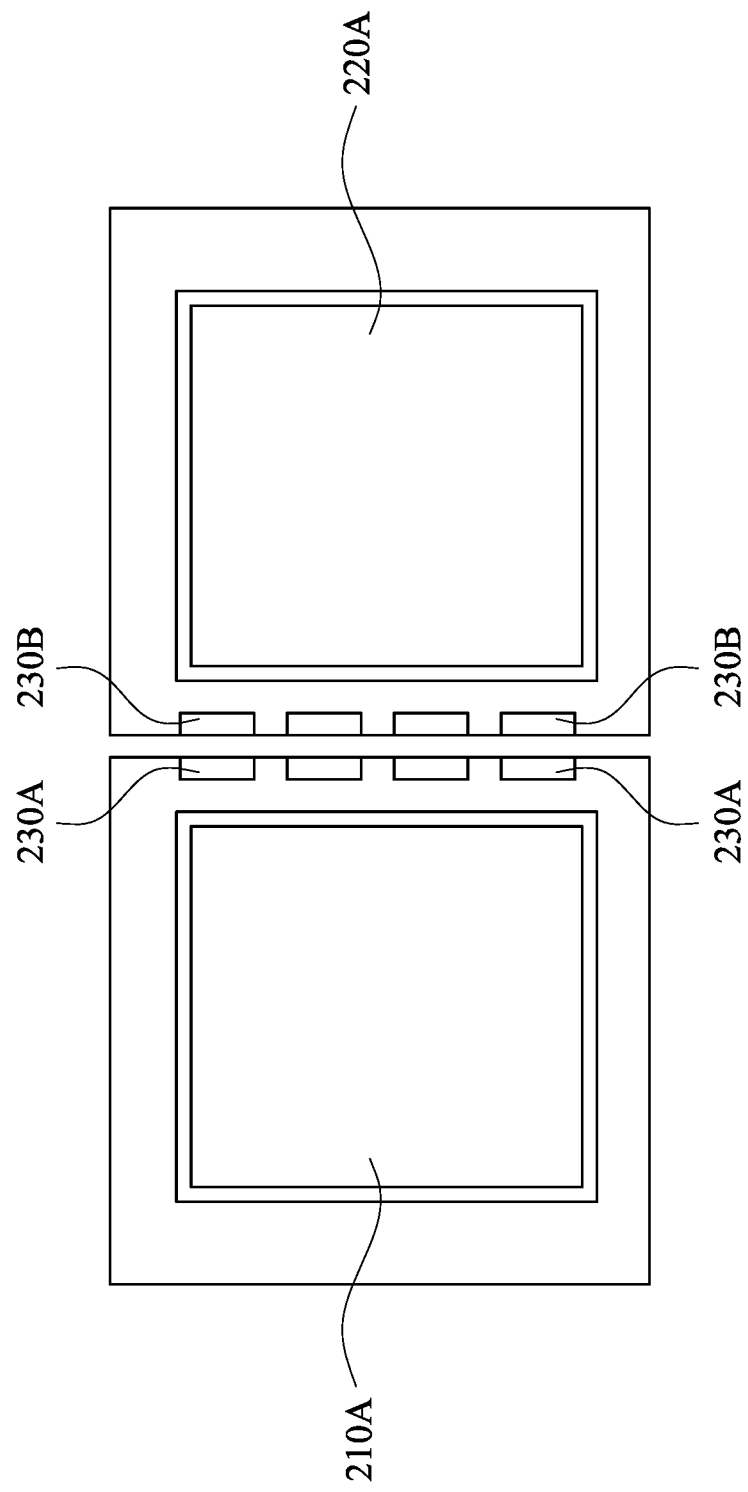

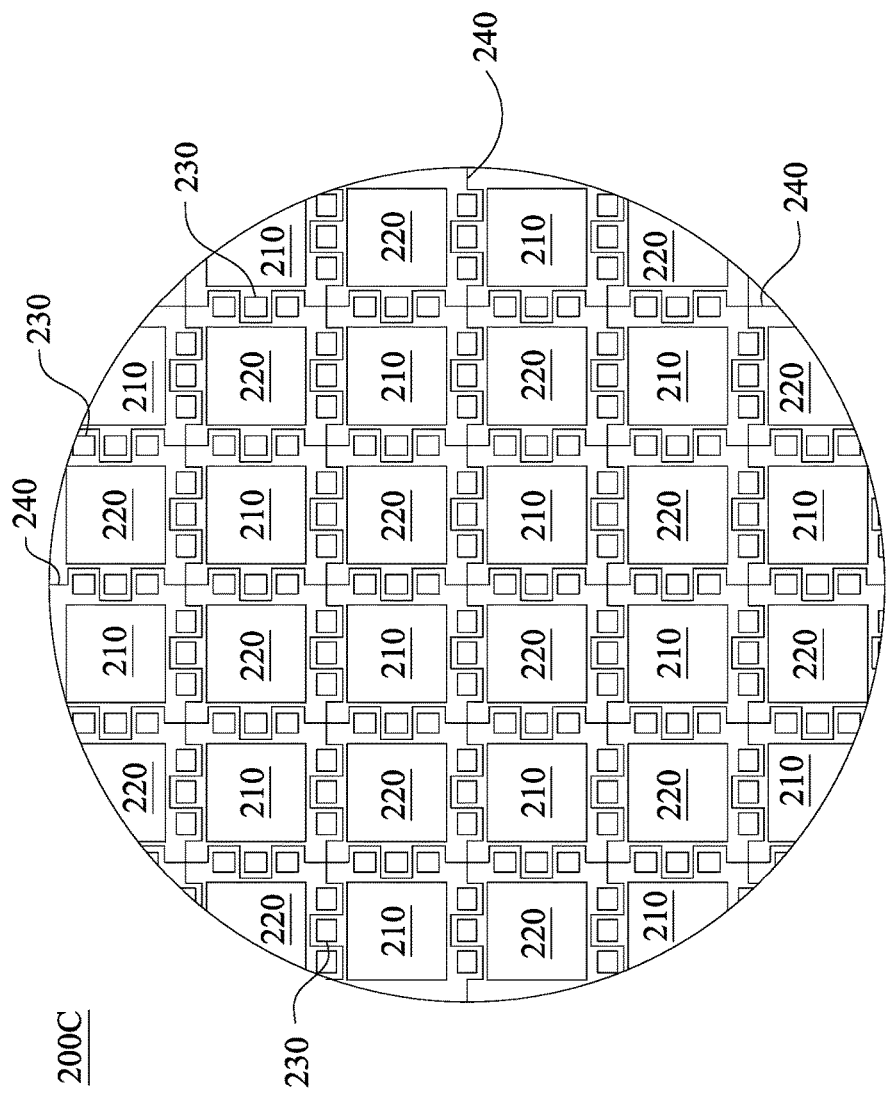

METHOD FOR WAFER DICING

RELATED APPLICATIONS

This application is a divisional application of U.S. Non-provisional patent application Ser. No. 14/577,141 filed on Dec. 19, 2014, which is herein incorporated by reference.

BACKGROUND

Upon the completion of semiconductor manufacturing processes, a large number of duplicate semiconductor chips are diced from a semiconductor wafer. These semiconductor chips are separated by scribe lines formed on the semiconductor wafer. Various techniques are employed to divide the semiconductor wafer along the scribe lines into individual dice with each die representing a specific semiconductor device chip. Conventional wafer dicing techniques include mechanical cleaving, laser dicing, and sawing with diamond blade. However, larger scribe lines are disposed on the semiconductor wafer for these wafer dicing techniques, and thus the gross die number of the semiconductor wafer is decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4B is a schematic diagram of a semiconductor wafer which is divided into semiconductor dice in accordance with alternative embodiments.

FIG. 5 is a schematic diagram of a semiconductor wafer in accordance with alternative embodiments.

DETAILED DESCRIPTION

Figure 1A:
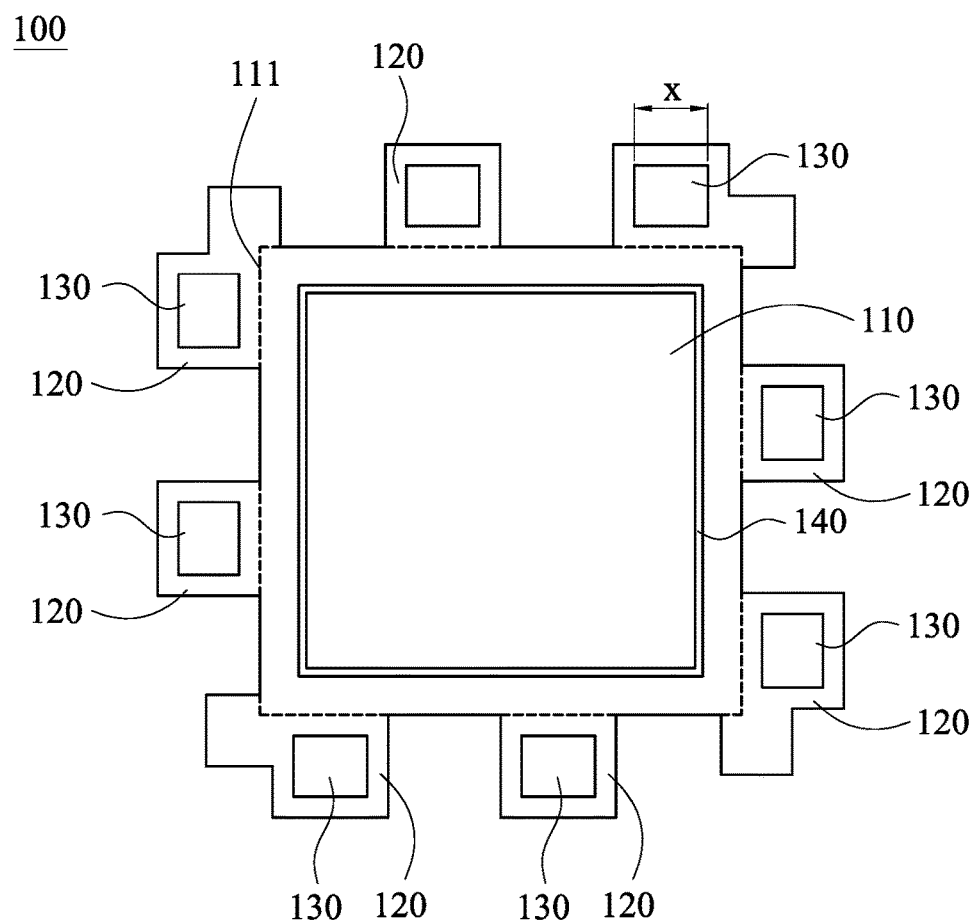
FIG. 1A is a schematic diagram of a semiconductor die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, the spatially relative terms are intended to encompass different orientations of the device in use or operation in addition to the orientation depicted in the figures. The apparatus may be otherwise oriented (rotated by 90 degrees or at other orientations) and the spatially relative descriptors used herein may likewise be interpreted accordingly.

Embodiments of the present disclosure are directed to a semiconductor die separated from a semiconductor wafer with bonding pads protruding its sidewalls, thereby increasing gross die number of the semiconductor wafer. Embodiments of the present disclosure are directed to a semiconductor wafer having bonding pads and a scribe line, in which the bonding pads are disposed on a border line between two semiconductor dice, and the scribe line meanders along or passes through each of the bonding pads, thereby increasing gross die number of the semiconductor wafer. In certain embodiments of the present disclosure, a wafer dicing method is provided by using a photolithographic operation.

FIG. 1A is a schematic diagram of a semiconductor die 100 in accordance with some embodiments. As shown in FIG. 1A, in some embodiments, the semiconductor die 100 may include one or more active and passive electronic devices, such as MOS transistors, radio frequency devices, optoelectronic devices, and the like. The semiconductor device die 100 may be in the form of a light emitting diode (LED), an image sensor, a semiconductor laser diode, etc. The semiconductor die 100 includes a base body 110, protruding portions 120 and bonding pads 130. The base body 110 has sidewalls 111, and the protruding portions 120 laterally protrude from the sidewalls 111 respectively. The protruding portions 120 of two opposite sidewalls 111 are staggered. The bonding pads 130 are disposed on the protruding portions 120 respectively. Each of the protruding portions 120 has one of the bonding pads 130 disposed thereon. In certain embodiments, each of the bonding pads 130 has a width x of about 90 μm.

In some embodiments, the semiconductor die 100 may include a seal ring 140 disposed in the base body 110, in which the sidewalls 111 are located between the seal ring 140 and the bonding pads 130. In some embodiments, the seal ring 140 includes oxide layers and metal layers, and each of the oxide layers is disposed between every two of the adjacent metal layers, in which each of the oxide layers has a width of about 1.1 μm and each of the metal layers has a width of about 2.5 μm.

Figure 1B:
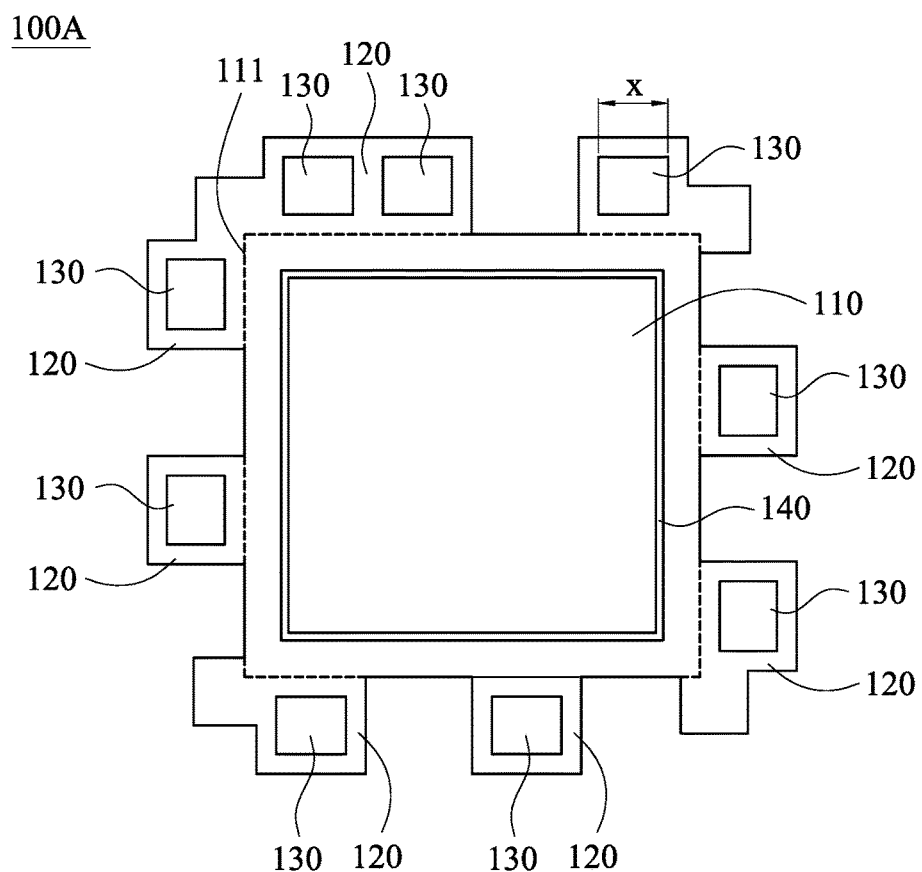
FIG. 1B to FIG. 1D are schematic diagrams of semiconductor dice in accordance with certain embodiments.
Figure 1C:
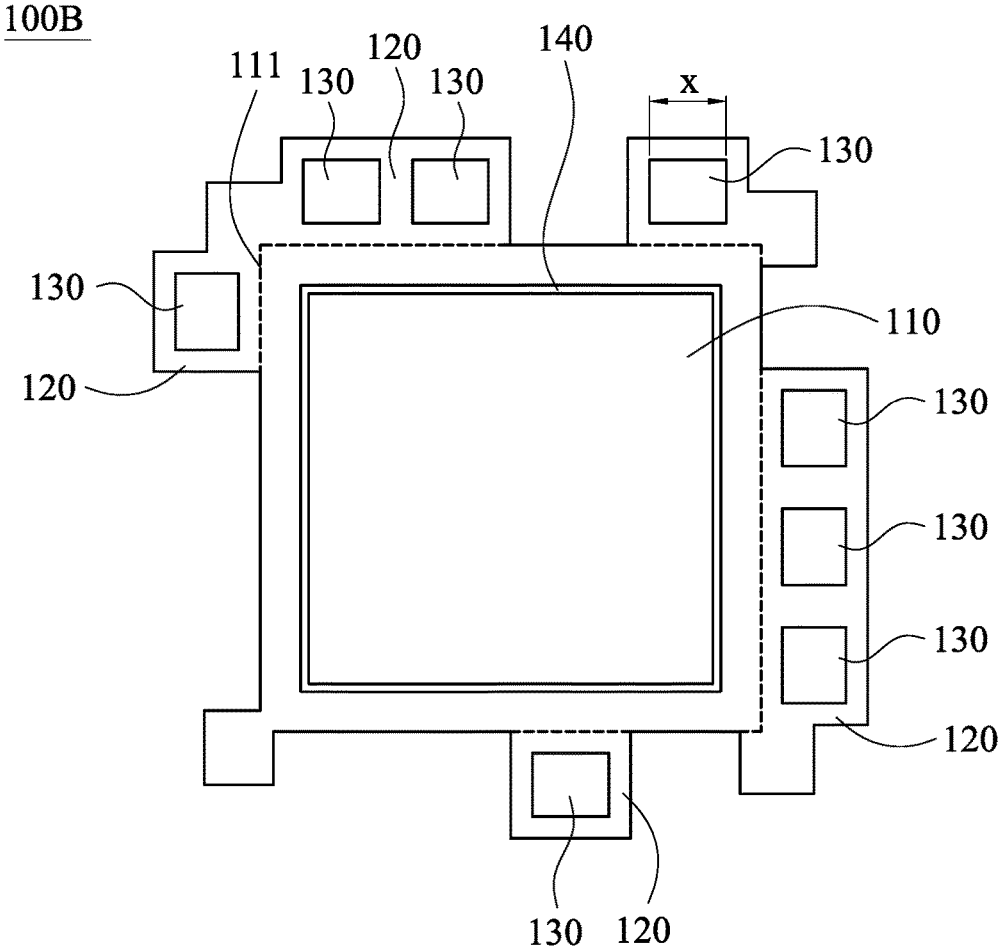
Figure 1D:
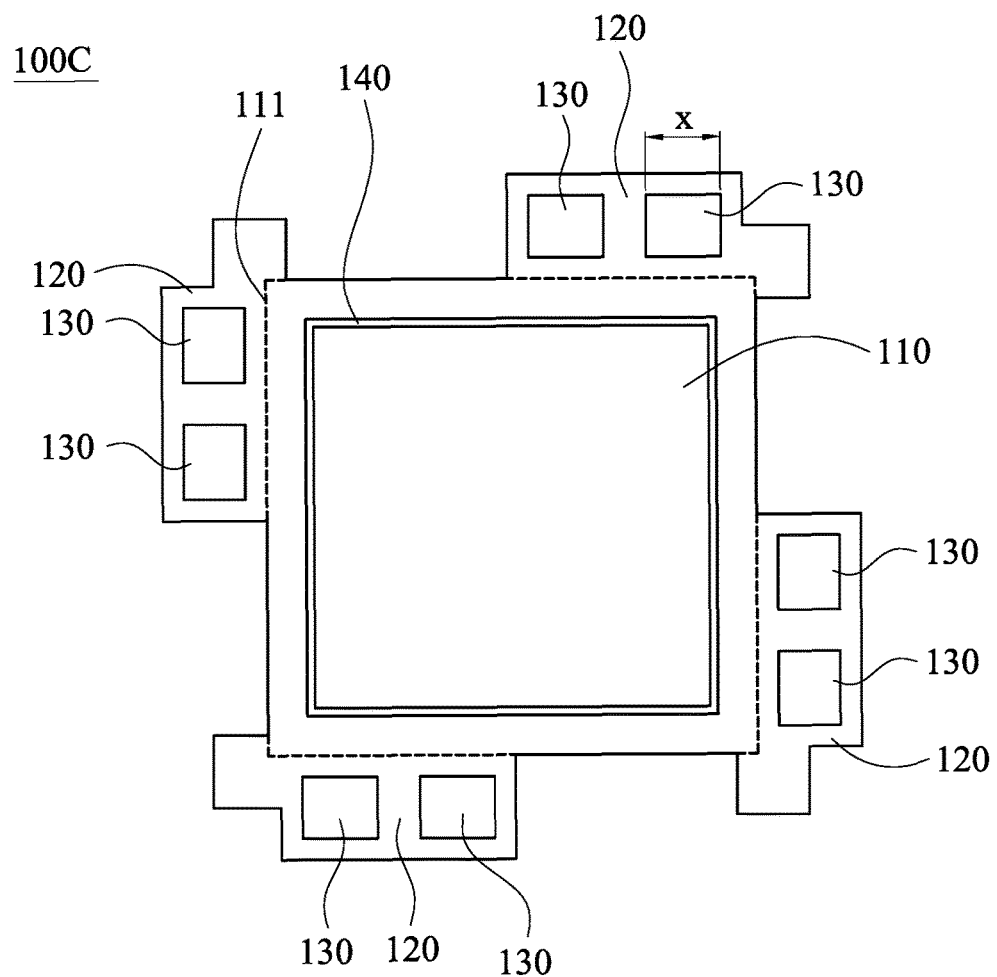

FIG. 1B to FIG. 1D are schematic diagrams of semiconductor dice 100A, 100B and 100C in accordance with certain embodiments. Each of the semiconductor dice 100A, 100B and 100C is similar to the semiconductor die 100 but has different arrangements of the bonding pads 130. In some embodiments, the semiconductor die 100A has a protruding portion 120 with two bonding pads 130 disposed thereon, as shown in FIG. 1B. In certain embodiments, the semiconductor die 100B has a protruding portion 120 with three bonding pads 130 disposed thereon, as shown in FIG. 1C. In alternative embodiments, the semiconductor die 100C has two bonding pads 130 disposed on each of the protruding portions 120, as shown in FIG. 1D. In some embodiments, the number of the bonding pads 130 disposed on each of the protruding portion 120 may vary according to product requirements.

Figure 2A:
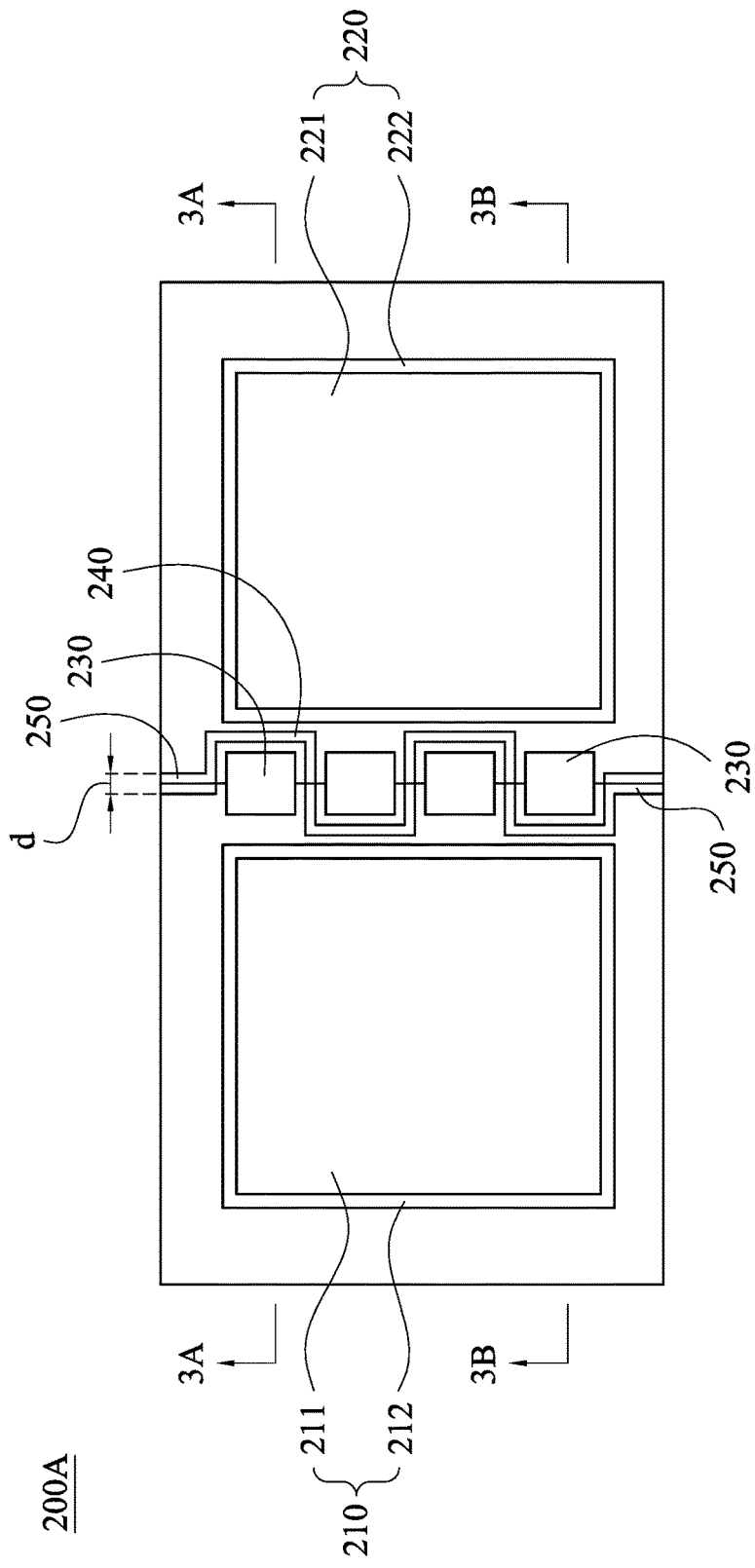
FIG. 2A is a schematic diagram of a semiconductor wafer in accordance with some embodiments.
Figure 2B:
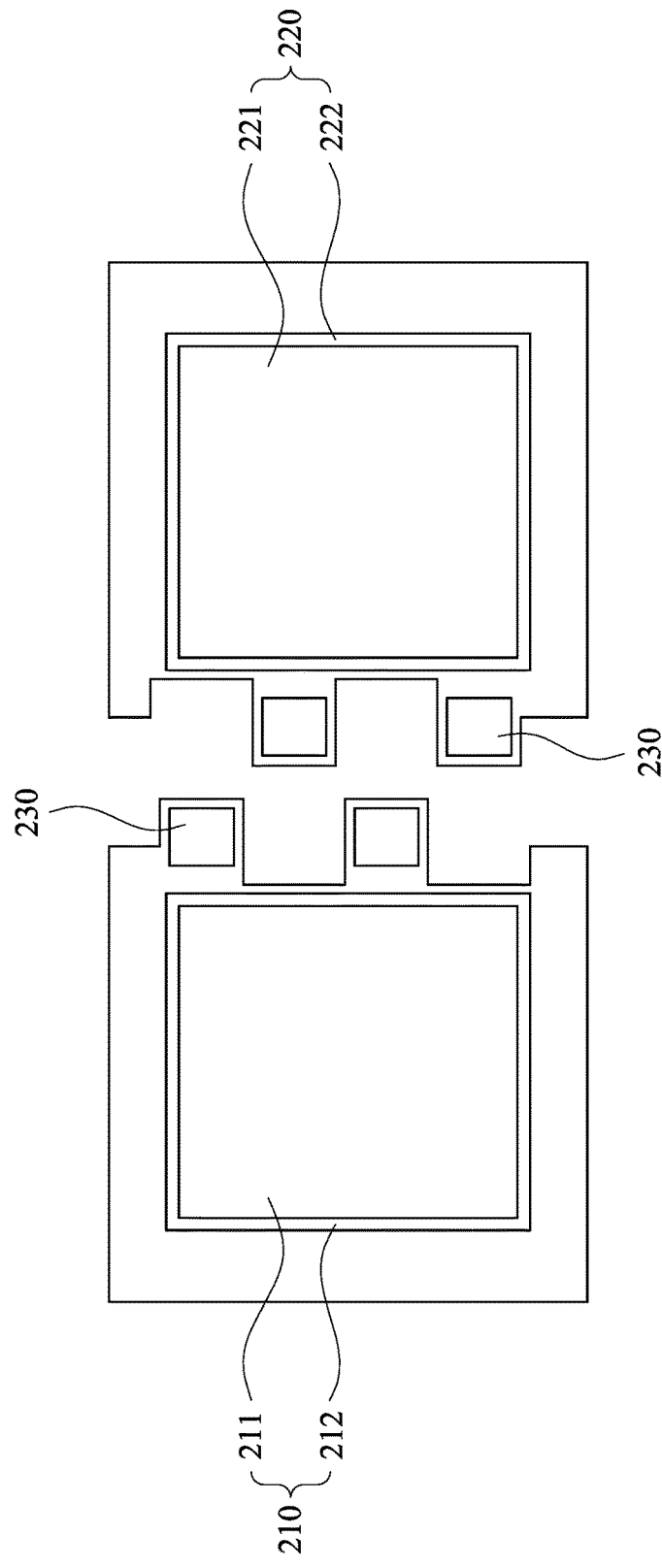
FIG. 2B is a schematic diagram of the semiconductor wafer which is divided into semiconductor dice in accordance with some embodiments.
Figure 3A:
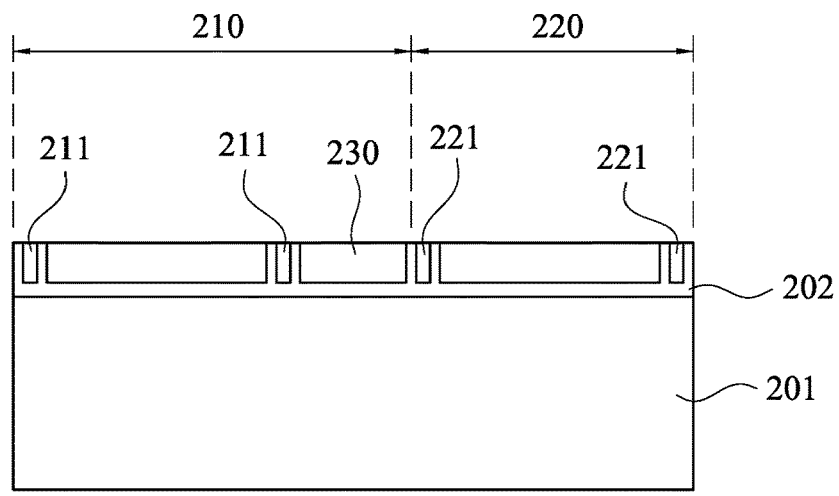
FIG. 3A is a schematic cross-sectional diagram of the semiconductor wafer viewed along line 3A-3A shown in FIG. 2A.
Figure 3B:
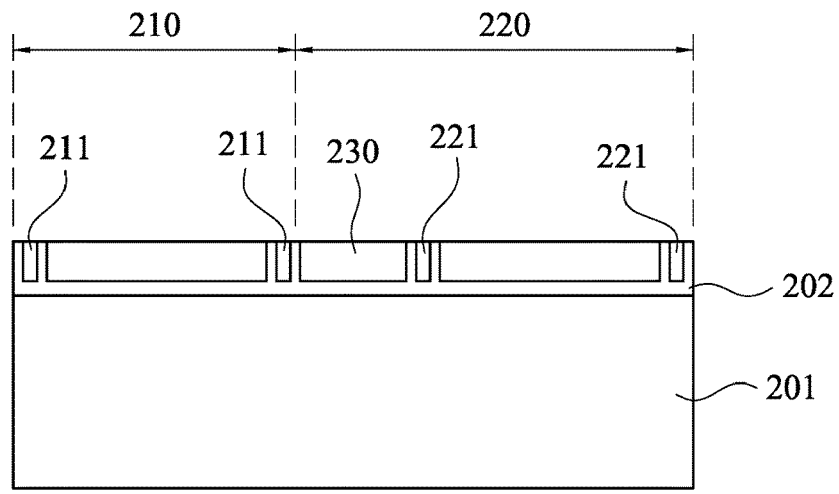
FIG. 3B is a schematic cross-sectional diagram of the semiconductor wafer viewed along line 3B-3B shown in FIG. 2A.

FIG. 2A is a schematic diagram of a semiconductor wafer 200A in accordance with some embodiments. FIG. 2B is a schematic diagram of a semiconductor wafer 200A which is divided into semiconductor dice 210 and 220 in accordance with some embodiments. FIG. 3A and FIG. 3B are schematic cross-sectional diagrams of the semiconductor wafer 200A in FIG. 2A viewed along line 3A-3A and line 3B-3B shown in FIG. 2A respectively. As shown in FIG. 2A, FIG. 2B, FIG. 3A and FIG. 3B, the semiconductor wafer 200A includes a substrate 201 and a top layer 202 formed on the substrate 201. The semiconductor dice 210 and 220 are processed and embedded into the top layer 202. Each of the semiconductor dice 210 and 220 may include one or more active and passive electronic devices, such as MOS transistors, radio frequency devices, optoelectronic devices, etc. The semiconductor device dice 210 and 220 may be in the form of, for example, an image sensor, a semiconductor laser diode, etc. For brief description, the top layer 202 is shown as a single layer, but the top layer 202 may comprise active layers disposed over the substrate 201, interconnect metal layers coupling the devices to form functional circuits, and an overlying protective passivation layer, in which active and/or passive devices are formed on the active layers.

In some embodiments, the substrate 201 may be formed from gallium arsenide (GaAs), gallium arsenide-phosphide (GaAsP), indium phosphide (InP), gallium phosphide (GaP), gallium aluminum arsenic (GaAlAs), indium gallium phosphide (InGaP), and the like.

In some embodiments, the semiconductor wafer 200A includes a first semiconductor die 210, a second semiconductor die 220, bonding pads 230 and a scribe line 240. The second semiconductor die 220 is connected to the first semiconductor die 210. The bonding pads 230 are disposed on a border line 250 between the first semiconductor die 210 and the second semiconductor die 220. In some embodiments, the bonding pads are collinear and the scribe line 240 is disposed along the bonding pads 230. In certain embodiments, the scribe line 240 may meander along (around) each of the bonding pads 230 and have a width d in a range from about 5 μm to about 50 μm, as shown in FIG. 2A.

Figure 4A:
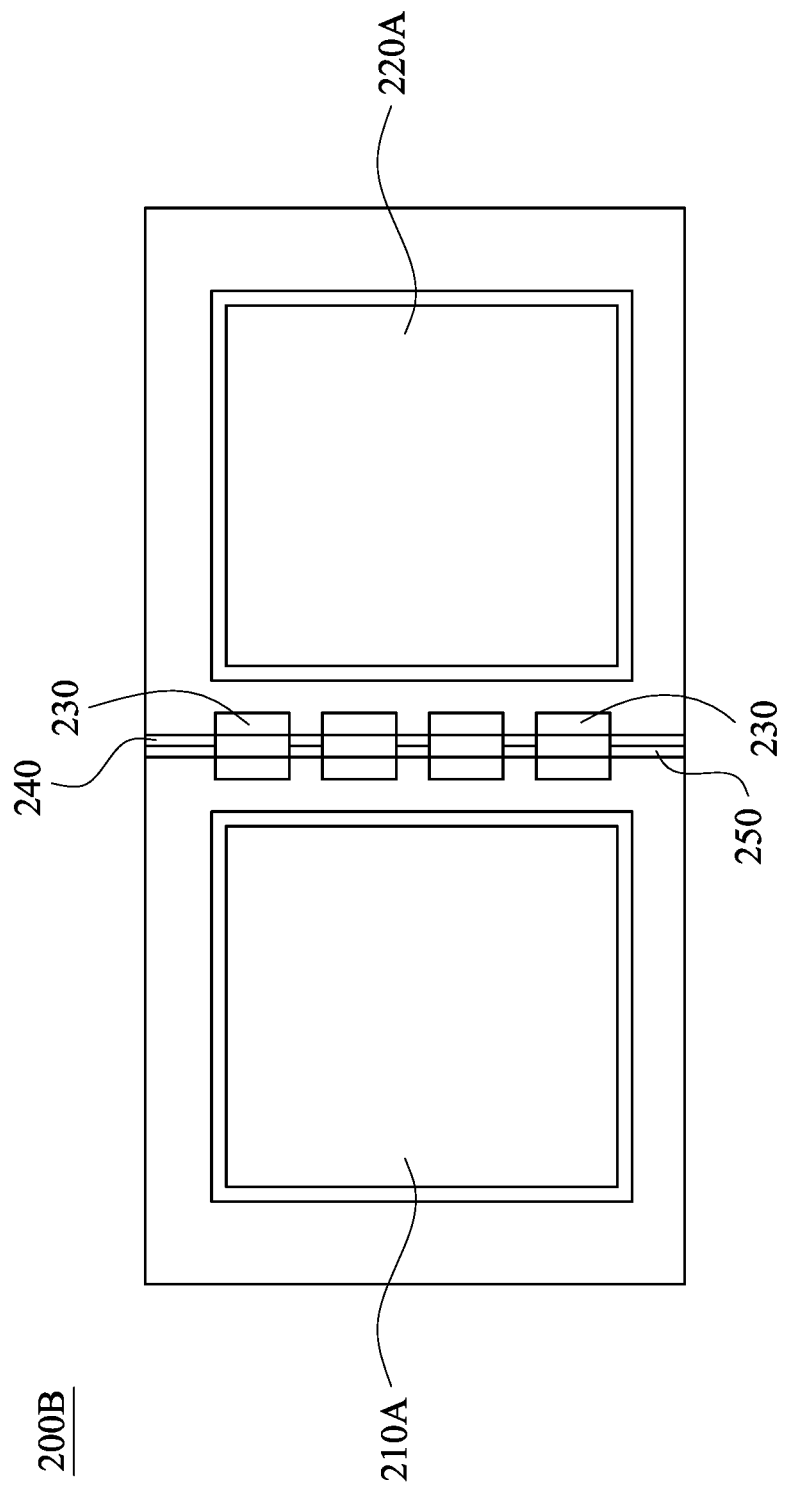
FIG. 4A is a schematic diagram of a semiconductor wafer in accordance with certain embodiments.

In alternative embodiments, FIG. 4A is a schematic diagram of a semiconductor wafer 200B in accordance with certain embodiments. FIG. 4B is a schematic diagram of a semiconductor wafer 200B which is divided into semiconductor dice 210A and 220A in accordance with alternative embodiments. As shown in FIG. 4A, the scribe line 240 passes through each of the bonding pads 230, and each of the bonding pads 230 are divided into two portions 230A and 230B. In some embodiments, the semiconductor wafer 200B may be used in a T-contact chip scale package (CSP) technique.

In some embodiments, the first semiconductor die 210 may include a first base body 211 and a first seal ring 212 disposed in the first base body 211, wherein a portion of the scribe line 240 is between the first seal ring 212 and a portion of the bonding pads 230.

In some embodiments, the second semiconductor die 220 may include a second base body 221 and a second seal ring 222 disposed in the second base body 221, in which a portion of the scribe line 240 is between the second seal ring 222 and a portion of the bonding pads 230.

Referring to FIG. 5, FIG. 5 is a schematic diagram of a semiconductor wafer 200C in accordance with alternative embodiments. The semiconductor wafer 200C may include first semiconductor dice 210, second semiconductor dice 220, bonding pads 230 and scribe line 240. Each of the first semiconductor dice 210 is surrounded by the second semiconductor dice 220, and each of the second semiconductor dice 220 is surrounded by the first semiconductor dice 210.

Figure 6A:
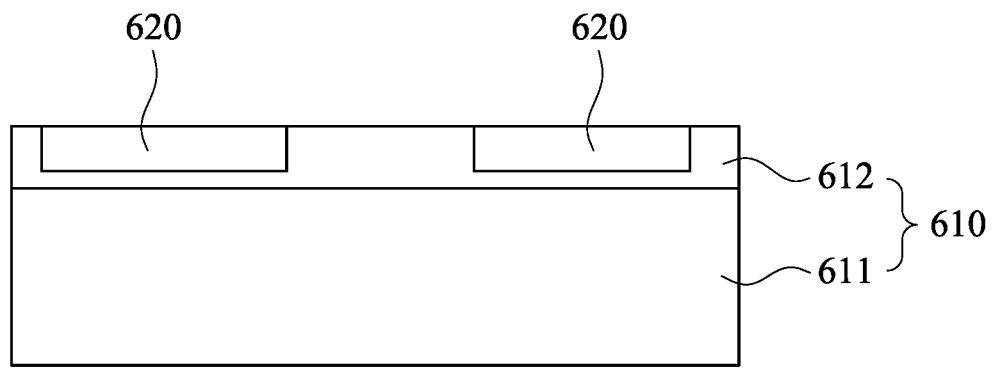
FIG. 6A to FIG. 6G are schematic cross-sectional views of intermediate stages showing a wafer dicing method in accordance with some embodiments.

FIG. 6A to FIG. 6G are schematic cross-sectional views of intermediate stages showing a wafer dicing method in accordance with some embodiments. As shown in FIG. 6A, chips 620 are formed on a semiconductor wafer 610. The semiconductor wafer 610 includes a substrate 611 and a top layer 612 formed on the substrate 611. The chips 620 have been processed and embedded into the top layer 612. Each of the chips 620 may include one or more active and passive electronic devices, such as MOS transistors, radio frequency devices, optoelectronic devices, and the like. The chips 620 may be in the form of a light emitting diode (LED), a semiconductor laser diode, and the like. To simplify description, the top layer 612 is shown as a single layer, but in reality, the top layer 612 may comprise active layers over the substrate 611 where active and/or passive devices are formed, interconnect metal layers coupling the devices forming functional circuits, and an overlying protective passivation layer.

In some embodiments, the substrate 611 may be formed form gallium arsenide (GaAs), gallium arsenide-phosphide (GaAsP), indium phosphide (InP), gallium phosphide (GaP), gallium aluminum arsenic (GaAlAs), indium gallium phosphide (InGaP), and the like. In certain embodiments, the substrate 611 may be sapphire substrate, and the top layer 612 may include Gallium nitride (GaN)/Indium gallium nitride (InGaN) LEDs.

Figure 6B:
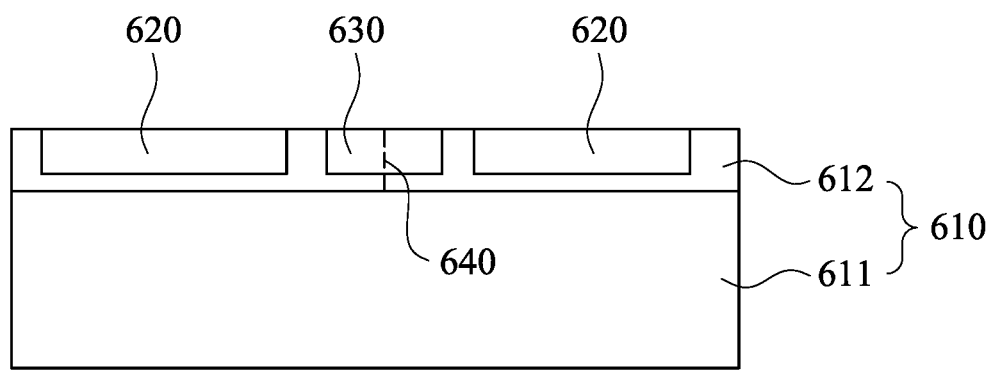
Figure 7A:
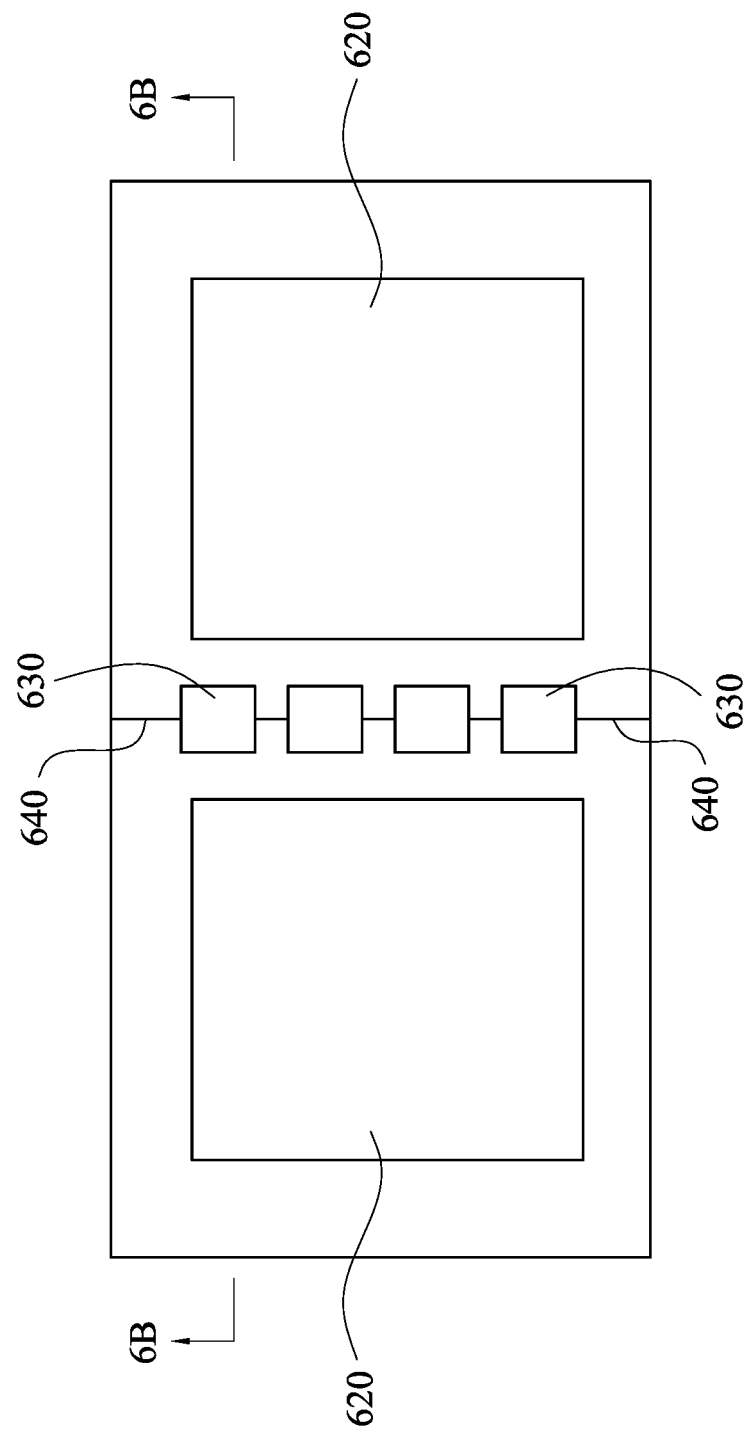
FIG. 7A is a schematic top view of the semiconductor dice shown in FIG. 6B.

As shown in FIG. 6B and FIG. 7A, FIG. 7A is a schematic top-view diagram of the semiconductor dice shown in FIG. 6B. Pads 630 are formed on a border line 640 between every two adjacent chips 620.

Figure 6C:
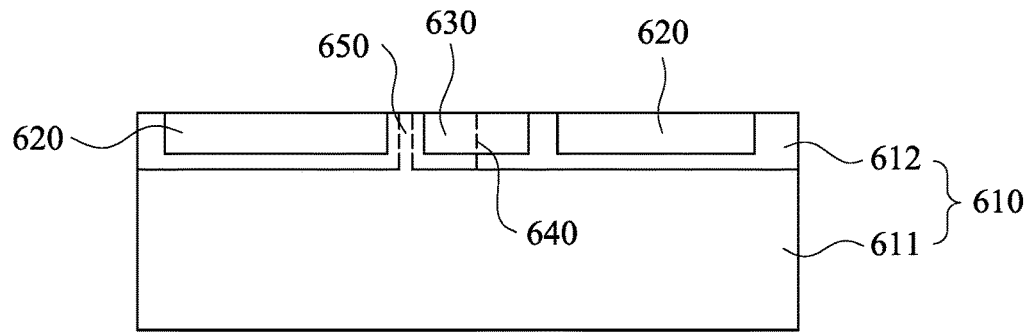
Figure 7B:
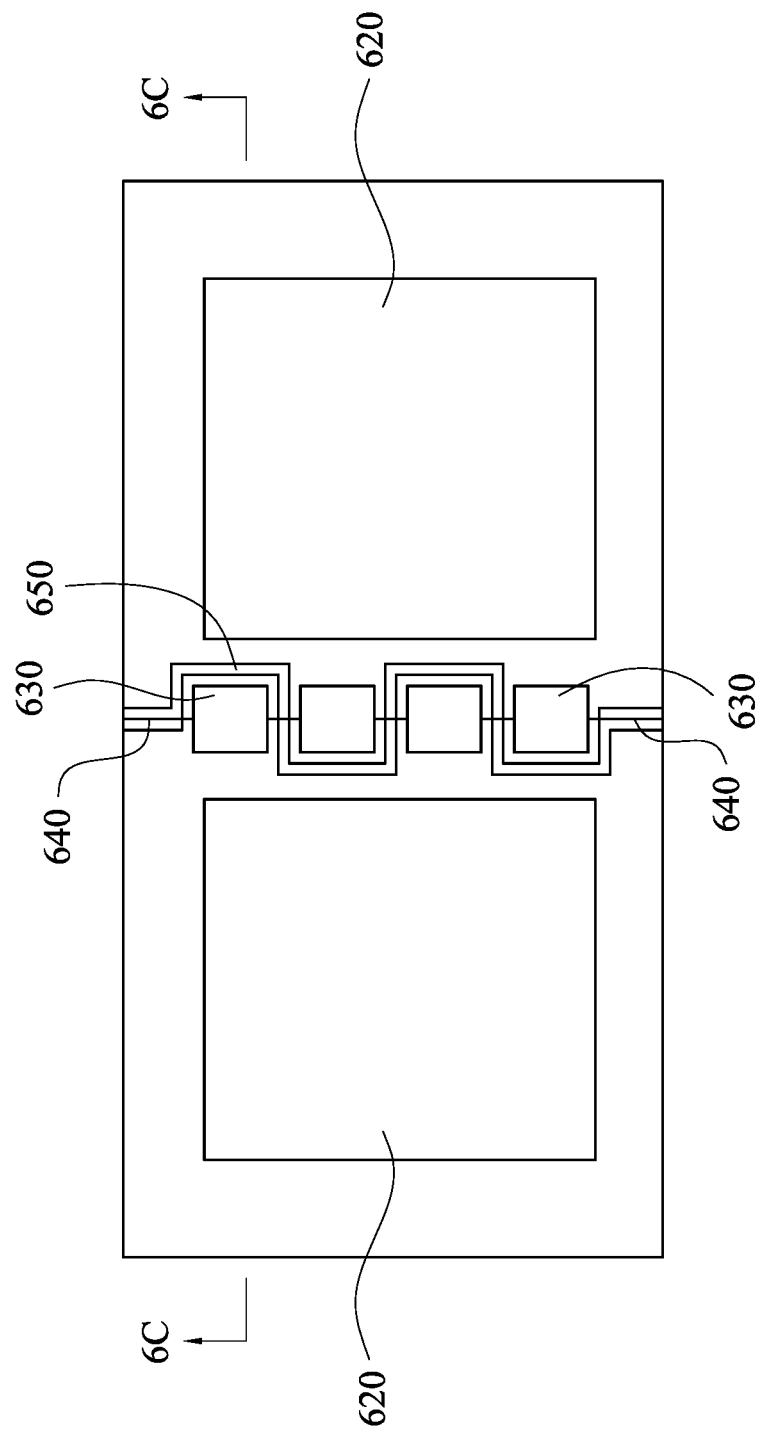
FIG. 7B is a schematic top-view of the semiconductor dice shown in FIG. 6C.
Figure 8:
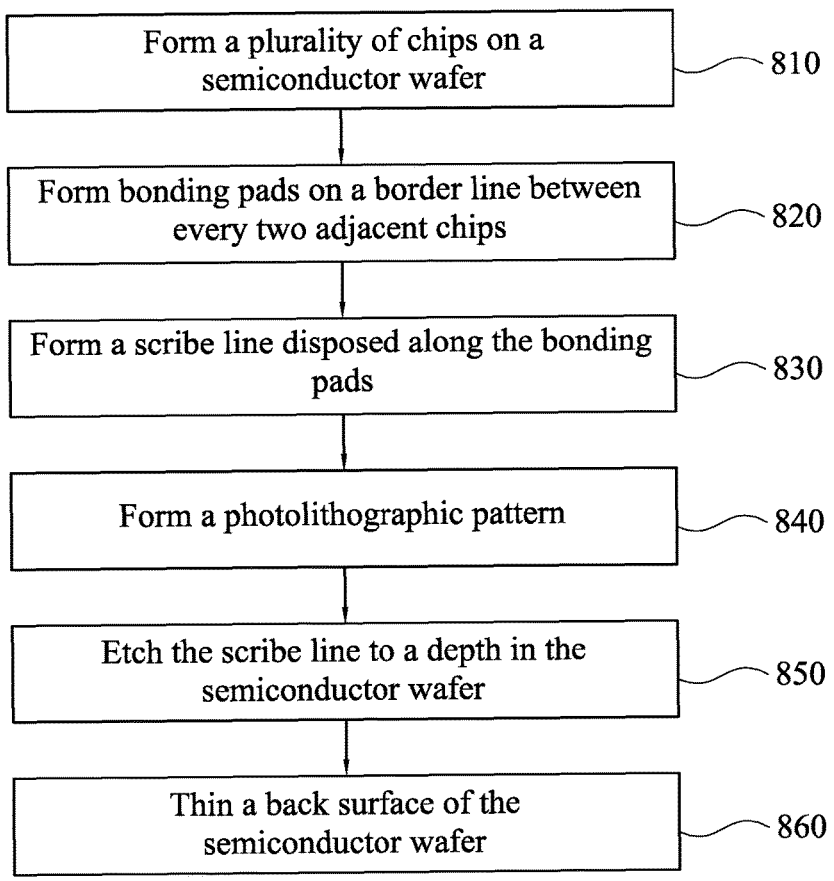
FIG. 8 is a flow chart of a wafer dicing method in accordance with some embodiments of the present disclosure.

As shown in FIG. 6C and FIG. 7B, FIG. 7B is a schematic top-view diagram of the semiconductor dice shown in FIG. 6C. A scribe line 650 is disposed along the bonding pads 630. In some embodiments, the scribe line 650 meanders along each of the bonding pads 630, as shown in FIG. 7B. In alternative embodiments, the scribe line 650 passes through each of the bonding pads 630, such as the scribe line 240 shown in FIG. 4A.

Figure 6D:
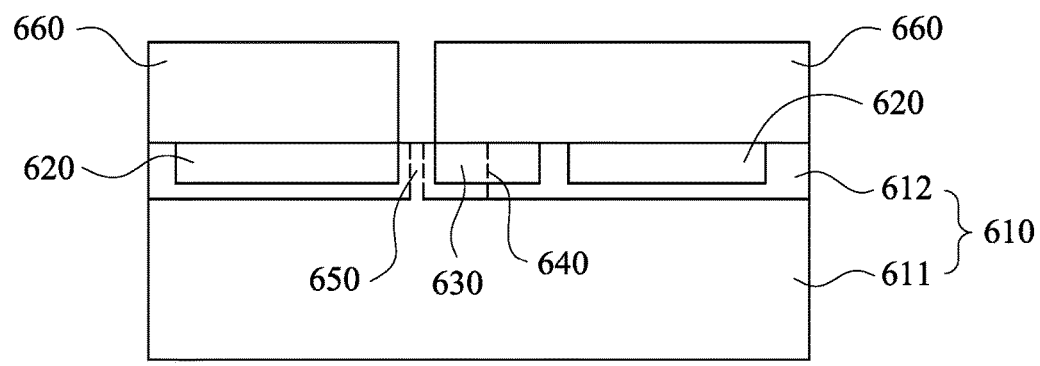

As shown in FIG. 6D, a photolithographic process is performed on the semiconductor wafer 610, and the scribe line 650 between the adjacent chips 620 is exposed. In some embodiments, a photolithographic pattern 660 is formed on the top layer 612 of the semiconductor wafer 610. In certain embodiments, a patterned photoresist material covers the chips 620 and the bonding pads 630 but exposes the scribe line 650.

Figure 6E:
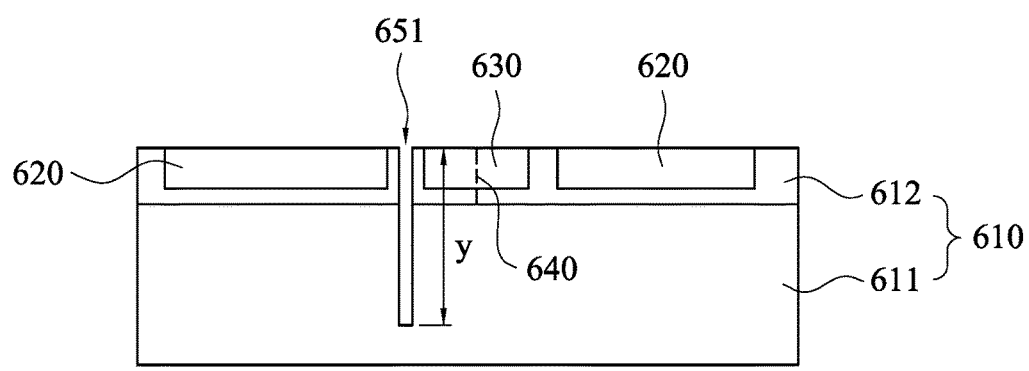

As shown in FIG. 6E, an etching process is applied on the semiconductor wafer 610 to remove the top layer 612 and a portion of the substrate 611 in the scribe line 650. In some embodiments, a time-controlling anisotropic plasma etching process is conducted on the substrate 611 to create deep trenches with a depth y from about 2 μm to about 75 μm. In certain embodiments, the scribe line 650 is etched to a width in a range from substantially 5 μm to substantially 50 μm. In alternative embodiments, an anisotropic plasma etching process creates an etched pattern 651 in the semiconductor wafer 610, which reaches a depth y greater than half of the wafer thickness of from about 600 microns to about 1000 microns. In certain embodiments, the anisotropic plasma etching process is capable of forming a substantially vertical etch profile with a large aspect ratio (depth vs. width), and thus is particularly useful when semiconductor dice are densely formed on a semiconductor wafer and the pitch between adjacent dice become very small. After the formation of etch profiles between adjacent semiconductor dice to be separated, the photoresist material is removed.

Figure 6F:
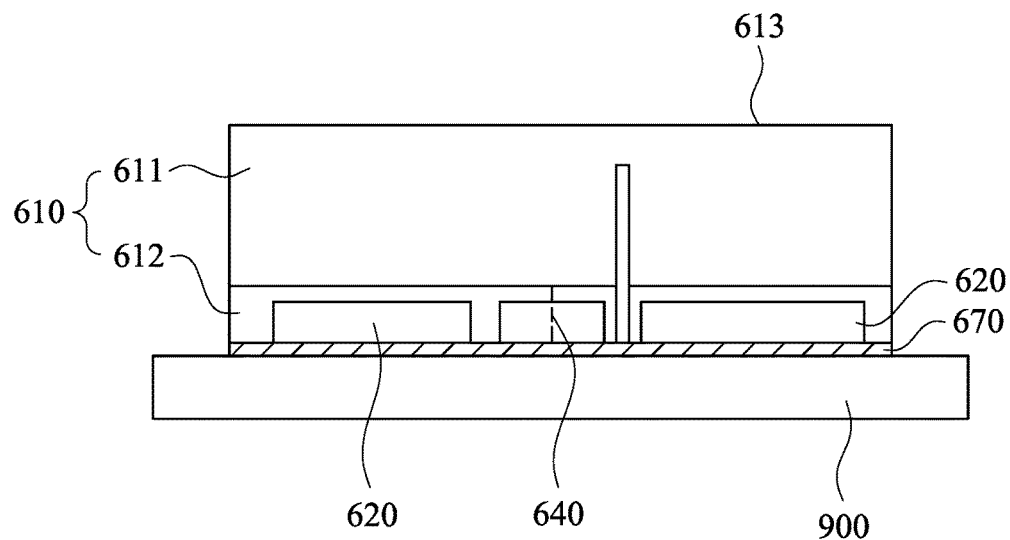

As shown in FIG. 6F, the semiconductor wafer 610 is mounted on a carrier disc, such as a sapphire disc 900, in which the semiconductor wafer 610 is flipped over and the top layer 612 is bound to the sapphire disc 900 with a tape 180. A backside 613 of the semiconductor wafer 610 is subsequently ground and polished until a portion of the semiconductor substrate 611 between the etched pattern 651 and the backside 155 is substantially removed. As a consequence, the semiconductor dice 600 are separated, as shown in FIG. 6G.

It is noted that the present disclosure utilizes a photolithographic operation to separate semiconductor dice. Typical wafer dicing techniques including mechanical cleaving, laser dicing, and sawing with diamond blade, require a larger scribe line between semiconductor dice, such as about 80 μm in width. However, the photolithographic operation used in the present disclosure only requires a smaller scribe line (about 5 μm to about 50 μm in width), thereby increasing the gross die number of the semiconductor wafer. Further, the bonding pads and the scribe line disposed on the semiconductor wafer are also arranged at predetermined locations. For example, the scribe line may meander along the bonding pads for forming the semiconductor dice with zigzag shapes, or may pass through the bonding pads for forming the semiconductor dice with rectangular shapes, which may be used in a T-contact chip scale package (CSP) technique.

Both of the aforementioned scribe lines can improve the gross die number. For the scribe line meandering along the bonding pads shown in FIG. 2B, the collinear bonding pads 230 distributed on the semiconductor dice 210 and 220 are staggered. On the semiconductor die 210, empty areas between two adjacent bonding pads 230 and at an edge of the semiconductor die 210 may be used for disposing conductive wires. Similarly, the semiconductor die 220 also has areas between two adjacent bonding pads 230 and at an edge of the semiconductor die 220. Therefore, when the bonding pads 230 and the scribe line 240 disposed on the semiconductor wafer 200A are arranged at the predetermined locations, less or no extra reserved regions are required on the semiconductor wafer 200A for disposing conductive wires, such that the gross die number of the semiconductor wafer 200A can be increased.

Figure 6G:
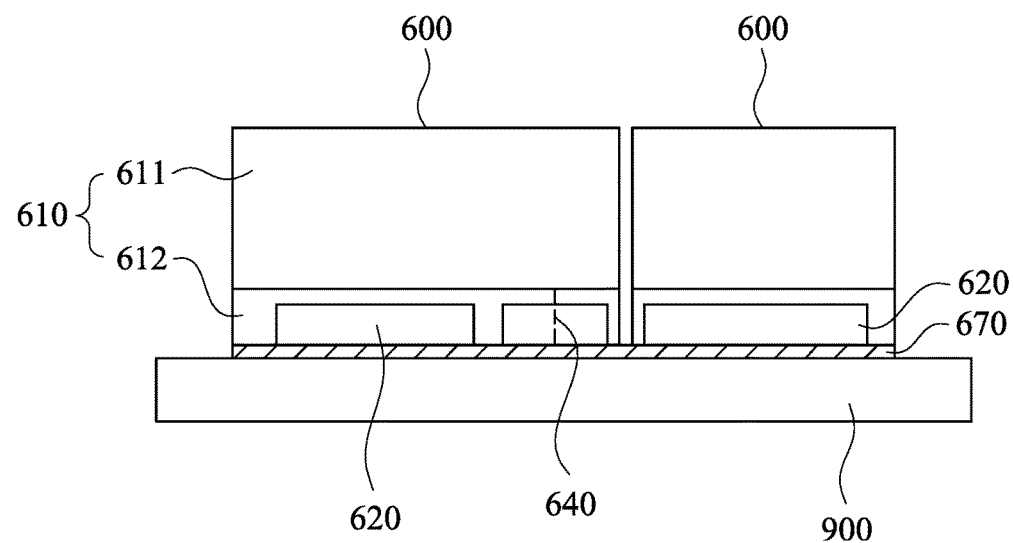

Referring to FIG. 6A to FIG. 6G and FIG. 8, FIG. 8 is a flow chart of a wafer dicing method 800 in accordance with some embodiments of the present disclosure. The method 800 begins at operation 810, where chips 620 are formed on a semiconductor wafer 610, as shown in FIG. 6A. At operation 820, bonding pads 630 on a border line 640 between every two adjacent chips 620, as shown in FIG. 6B. At operation 830, a scribe line 650 is disposed along the bonding pads 630, as shown in FIG. 6C. At operation 840, a photolithographic pattern 660 is formed on a top layer 612 of the semiconductor wafer 610 to expose the scribe line 650, as shown in FIG. 6D. At operation 850, the scribe line 650 is etched to a depth y in the semiconductor wafer substantially below the top layer 612 to form an etched pattern 651, as shown in FIG. 6E. At operation 860, a back surface 613 of the semiconductor wafer 610 is thinned until the etched pattern 651 in the semiconductor wafer 610 is exposed, as shown in FIG. 6F and FIG. 6G.

In accordance with some embodiments, the present disclosure discloses a semiconductor die. The semiconductor die includes a base body, protruding portions and bonding pads. The base body has sidewalls. The protruding portions are laterally protruding from the sidewalls respectively. The bonding pads are disposed on the protruding portions respectively.

In accordance with certain embodiments, the present disclosure discloses a semiconductor wafer. The semiconductor wafer includes a first semiconductor die, a second semiconductor die, bonding pads and a scribe line. The second semiconductor die is connected to the first semiconductor die. The bonding pads are disposed on a border line between the first semiconductor die and the second semiconductor die. The scribe line is disposed along the bonding pads.

In accordance with alternative embodiments, the present disclosure discloses a method for separating semiconductor dice. In this method, chips are formed on a semiconductor wafer. Bonding pads are formed on a border line between every two adjacent chips. A scribe line is formed and disposed along the bonding pads. A photolithographic pattern is formed on a top layer of the semiconductor wafer to expose the scribe line. The scribe line is etched to a depth in the semiconductor wafer substantially below the top layer to form an etched pattern. A back surface of the semiconductor wafer is thinned until the etched pattern in the semiconductor wafer is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer dicing method, comprising:
    forming a plurality of chips on a semiconductor wafer;
    forming a plurality of bonding pads at a border line between every two of the adjacent chips;
    forming a scribe line disposed along the bonding pads;
    forming a photolithographic pattern on a top layer of the semiconductor wafer to expose the scribe line;
    etching the scribe line to a depth in the semiconductor wafer substantially below the top layer to form an etched pattern; and
    thinning a back surface of the semiconductor wafer until the etched pattern in the semiconductor wafer is exposed.

2. The wafer dicing method of claim 1, wherein the operation of providing the semiconductor wafer further comprises providing the semiconductor wafer formed from a material including gallium arsenide (GaAs), gallium arsenide-phosphide (GaAsP), indium phosphide (InP), gallium phosphide (GaP), gallium aluminum arsenic (GaAlAs), indium gallium phosphide (InGaP), gallium nitride (GaN), Indium gallium nitride (InGaN), GaN/InGaN on sapphire, silicon (Si), germanium (Ge), silicon germanium (SiGe) or a printed circuit board (PCB).

3. The wafer dicing method of claim 1, wherein forming the scribe line disposed along the bonding pads further comprises forming the scribe line meandering along each of the bonding pads.

4. The wafer dicing method of claim 1, wherein forming the scribe line disposed along the bonding pads further comprises forming the scribe line passing through each of the bonding pads.

5. The wafer dicing method of claim 1, wherein after etching the scribe line to the depth in the semiconductor wafer substantially below the top layer, further comprising mounting a tape on the top layer of the semiconductor wafer, thereby exposing the back surface of the semiconductor wafer.

6. The wafer dicing method of claim 1, wherein etching the scribe line to the depth in the semiconductor wafer substantially below the top layer further comprises etching the scribe line to the depth in the semiconductor wafer substantially below the top layer using a plasma etching process.

7. The wafer dicing method of claim 1, wherein etching the scribe line to the depth in the semiconductor wafer substantially below the top layer further comprises etching the scribe line to the depth in a range substantially from 2 μm to 75 μm.

8. The wafer dicing method of claim 1, wherein etching the scribe line to the depth in the semiconductor wafer substantially below the top layer further comprises etching the scribe line to a width in a range substantially from 5 μm to 50 μm.

9. The wafer dicing method of claim 1, wherein forming the bonding pads at the border line between every two of the adjacent chips forms each of the bonding pads with a width of substantially 90 μm.

10. The wafer dicing method of claim 1, wherein forming the bonding pads at the border line between every two of the adjacent chips forms the bonding pads that are co-linear.

11. The wafer dicing method of claim 1, wherein forming the scribe line disposed along the bonding pads forms the scribe line that meanders along each of the bonding pads.

12. The wafer dicing method of claim 1, wherein forming the scribe line disposed along the bonding pads forms the scribe line passing through each of the bonding pads.

13. A wafer dicing method, comprising:
   forming a plurality of chips on a semiconductor wafer, wherein each of the chips has a sidewall and a plurality of protruding portions laterally protruding from the sidewall;
   forming a plurality of bonding pads on the protruding portions at a border line between every two of the adjacent chips; and
   forming a scribe line disposed along the bonding pads.

14. The wafer dicing method of claim 13, further comprising:
   forming a photolithographic pattern on a top layer of the semiconductor wafer to expose the scribe line;
   etching the scribe line to a depth in the semiconductor wafer substantially below the top layer to form an etched pattern; and
   thinning a back surface of the semiconductor wafer until the etched pattern in the semiconductor wafer is exposed.

15. The wafer dicing method of claim 14, wherein etching the scribe line to the depth in the semiconductor wafer substantially below the top layer further comprises etching the scribe line to a width in a range substantially from 5 μm to 50 μm.

16. The wafer dicing method of claim 13, wherein forming the scribe line disposed along the bonding pads further comprises forming the scribe line meandering along each of the bonding pads.

17. The wafer dicing method of claim 13, wherein forming the scribe line disposed along the bonding pads further comprises forming the scribe line passing through each of the bonding pads.

18. A wafer dicing method, comprising:
   forming a plurality of chips on a semiconductor wafer;
   forming a plurality of bonding pads at a border line between every two of the adjacent chips; and
   forming a scribe line disposed along the bonding pads, wherein the scribe line has a width in a range from substantially 5 μm to substantially 50 μm.

19. The wafer dicing method of claim 18, wherein forming the scribe line disposed along the bonding pads comprises:
   forming a photolithographic pattern on a top layer of the semiconductor wafer to expose the scribe line; and
   etching the scribe line to a depth in the semiconductor wafer substantially below the top layer to form an etched pattern.

20. The wafer dicing method of claim 19, further comprising:
   thinning a back surface of the semiconductor wafer until the etched pattern in the semiconductor wafer is exposed.

* * * * *